United States Patent [19]
Fukuda

[11] Patent Number: 5,870,528
[45] Date of Patent: Feb. 9, 1999

[54] AUTOMATIC MDF APPARATUS

[75] Inventor: Haruyuki Fukuda, Tokyo, Japan

[73] Assignee: Oki Electric Industry Co., Ltd., Tokyo, Japan

[21] Appl. No.: 737,794

[22] PCT Filed: Apr. 26, 1996

[86] PCT No.: PCT/JP96/01165

§ 371 Date: Nov. 25, 1996

§ 102(e) Date: Nov. 25, 1996

[87] PCT Pub. No.: WO96/34497

PCT Pub. Date: Oct. 31, 1996

[30] Foreign Application Priority Data

Apr. 27, 1995 [JP] Japan .................................. 7-104246
Apr. 28, 1995 [JP] Japan .................................. 7-106637
Sep. 29, 1995 [JP] Japan .................................. 7-253598

[51] Int. Cl.$^6$ .................................................. G06F 19/00
[52] U.S. Cl. ................................ 395/80; 361/803; 439/45
[58] Field of Search ........................ 364/167.01; 395/80, 395/89; 439/44, 45, 48, 49, 75; 385/17; 29/749, 757, 830; 361/679, 790, 805

[56] References Cited

U.S. PATENT DOCUMENTS 4,011,493  3/1977  Fukase et al. ..................... 364/147 X
4,485,453  11/1984  Taylor ............................... 364/191 X
5,017,145  5/1991  Kanai et al. ............................ 439/45

FOREIGN PATENT DOCUMENTS 1-276524A  11/1989  Japan .
5-136878A  6/1993  Japan .
5-176356A  7/1993  Japan .

OTHER PUBLICATIONS

"A New Automated Main Distributing Frame System Using Robot", Kiyoshi Yoshida et al, 1991 IEEE, pp. 0977–0982.

*Primary Examiner*—Joseph Ruggiero
*Attorney, Agent, or Firm*—Venable; Robert J. Frank; Allen Wood

[57] ABSTRACT

An automatic main distributing frame (MDF) apparatus for connecting and disconnecting an exchange and a user terminal includes a first-staged matrix board having a plurality of input/output lines, the input/output lines being disposed in a matrix pattern. The MDF apparatus also includes second-staged and third-staged matrix boards having a plurality of input/output lines, the input/output lines also being disposed in matrix patterns. The second-staged matrix board is disposed perpendicular to the first matrix board and the third-staged matrix board is disposed perpendicular to the second matrix board. A center board is disposed between the first-staged matrix board and the second-staged matrix board and between the second-staged matrix board and the third-staged matrix board. The center board, the first-staged matrix board, the second-staged matrix board, and the third-staged matrix board are mutually connected through connectors.

19 Claims, 14 Drawing Sheets

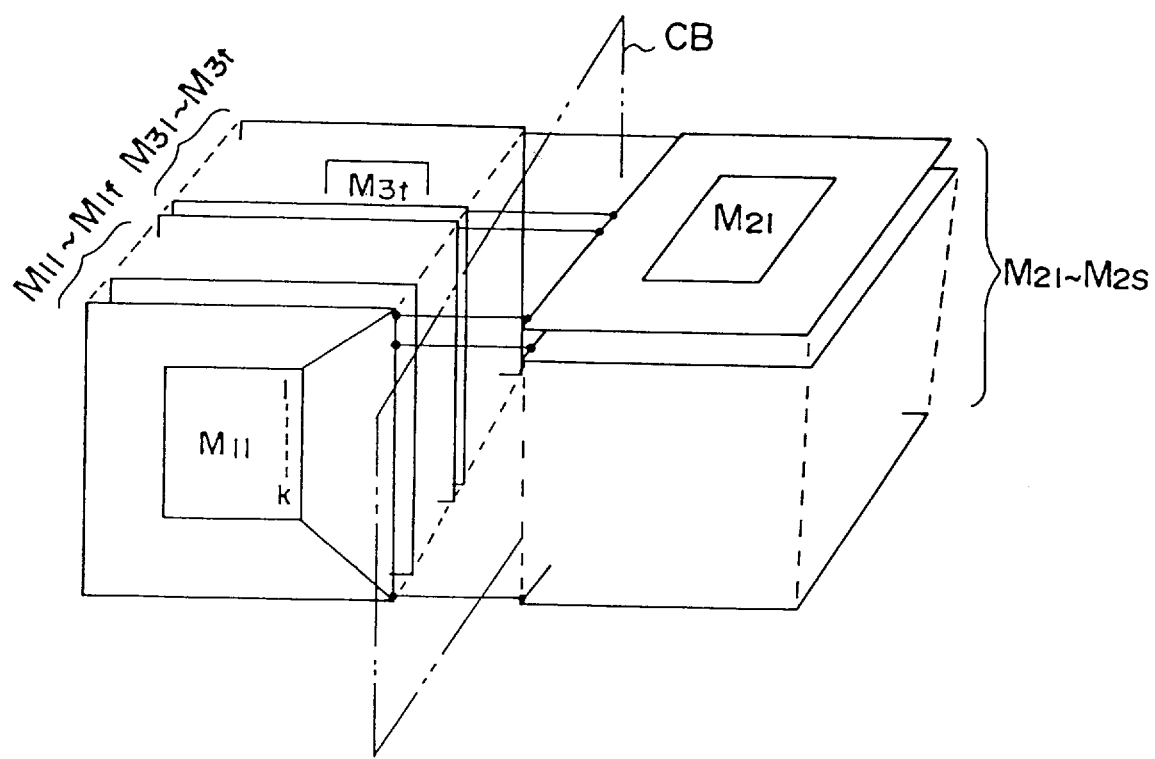
F I G. 1

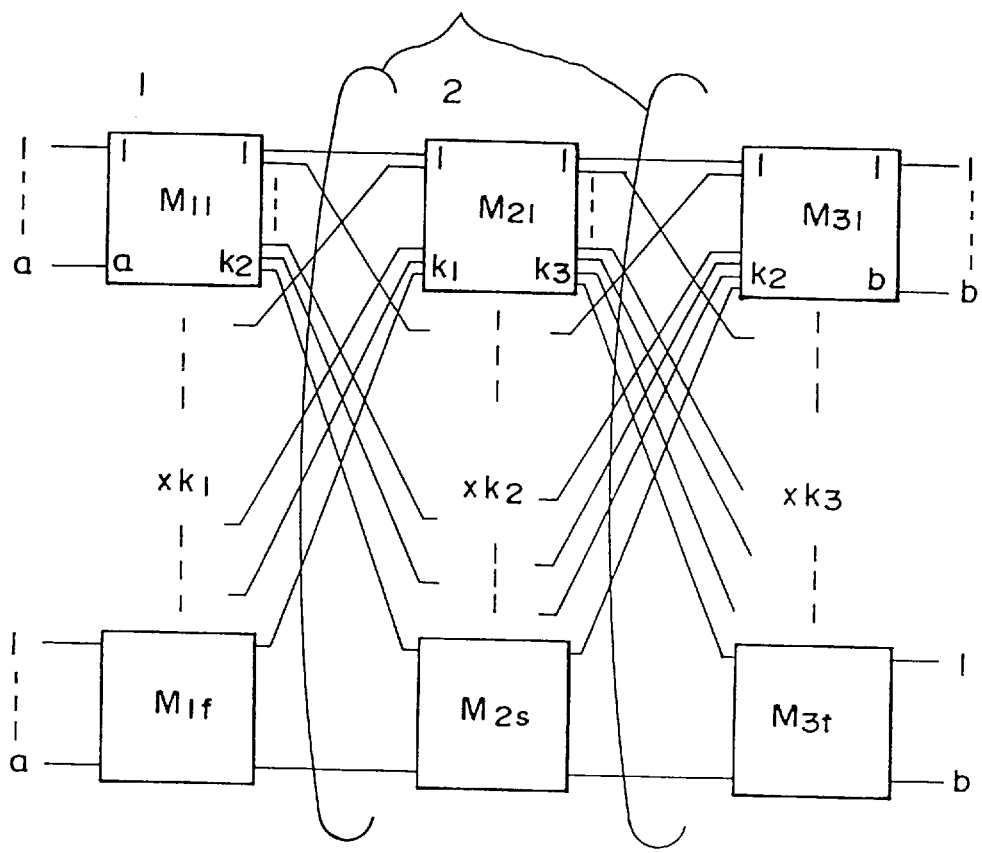
F I G. 2

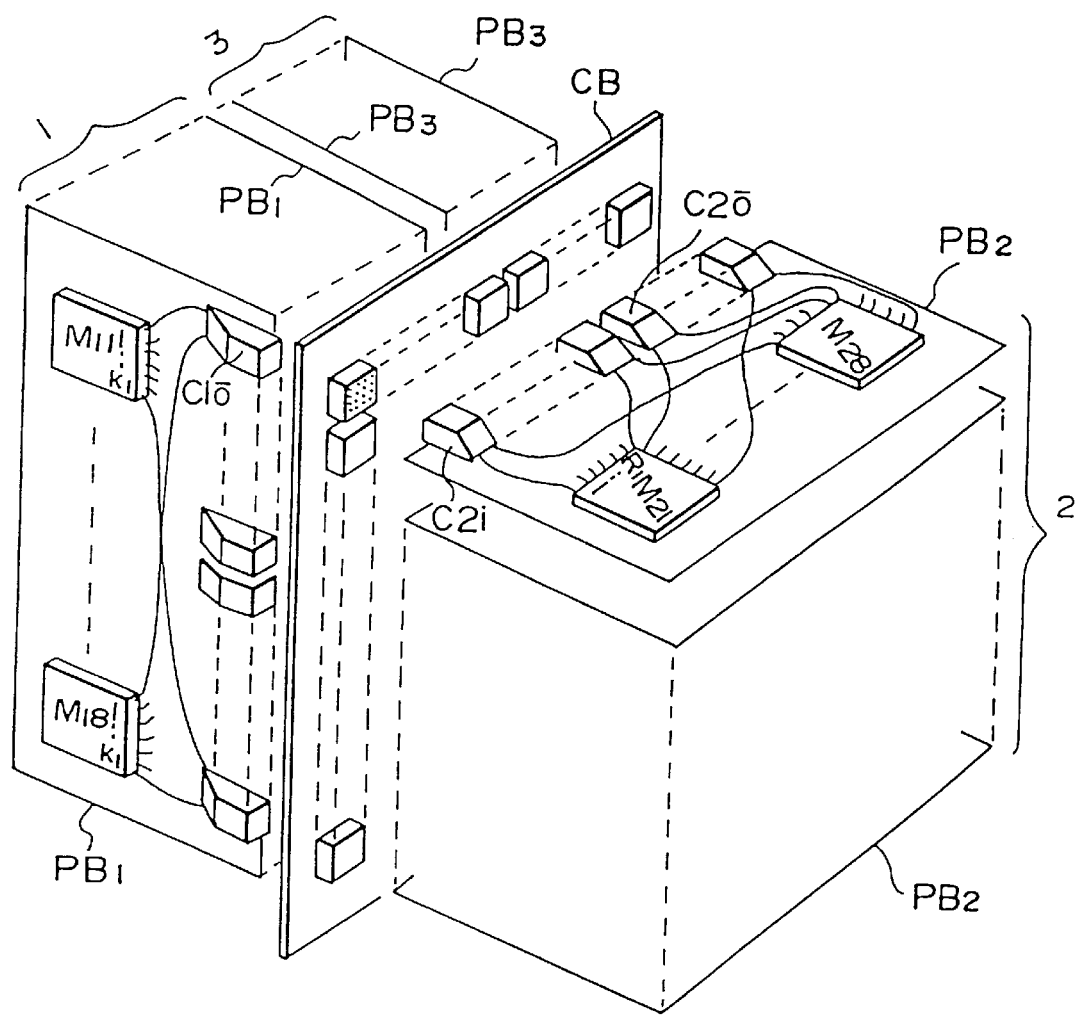
F I G. 4

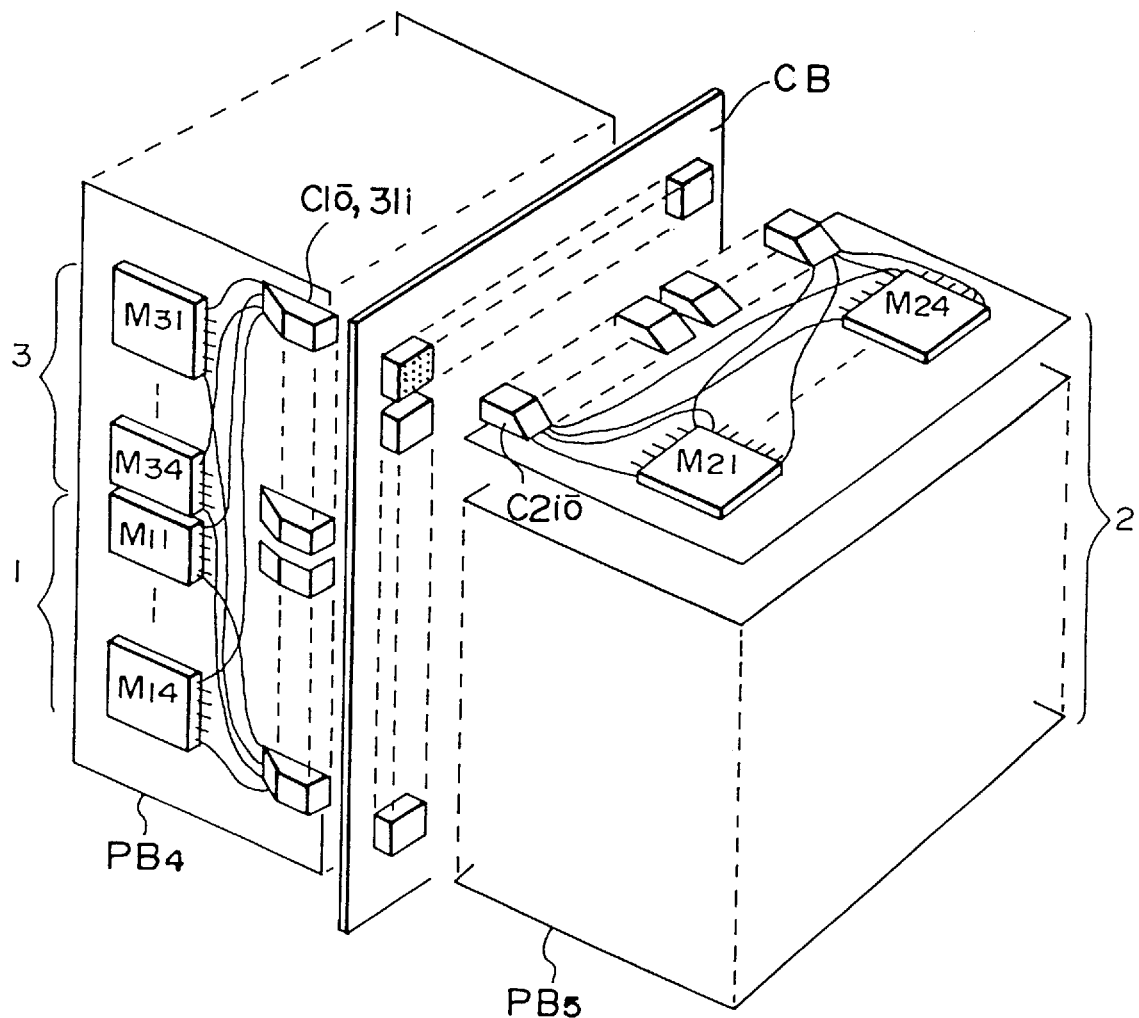
F I G. 6

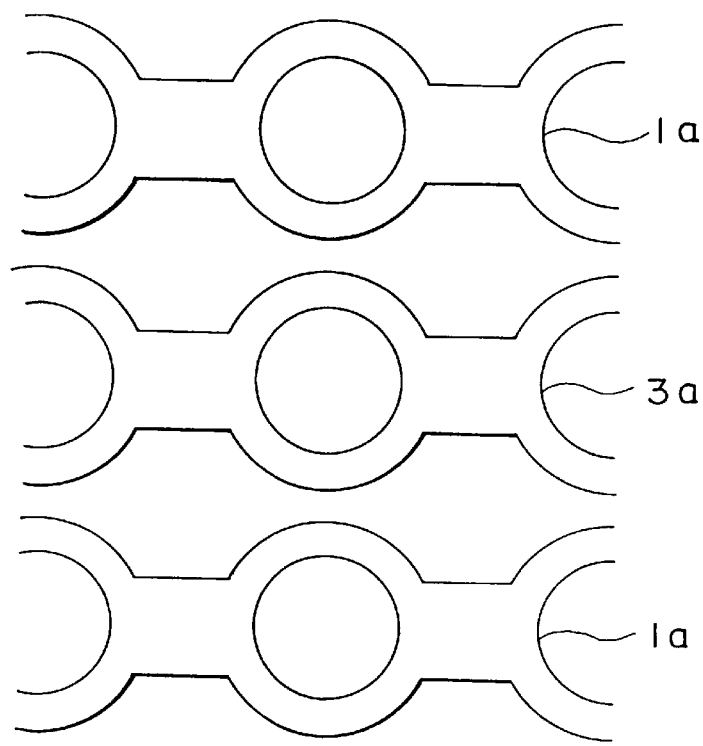
F I G. 9 (a)
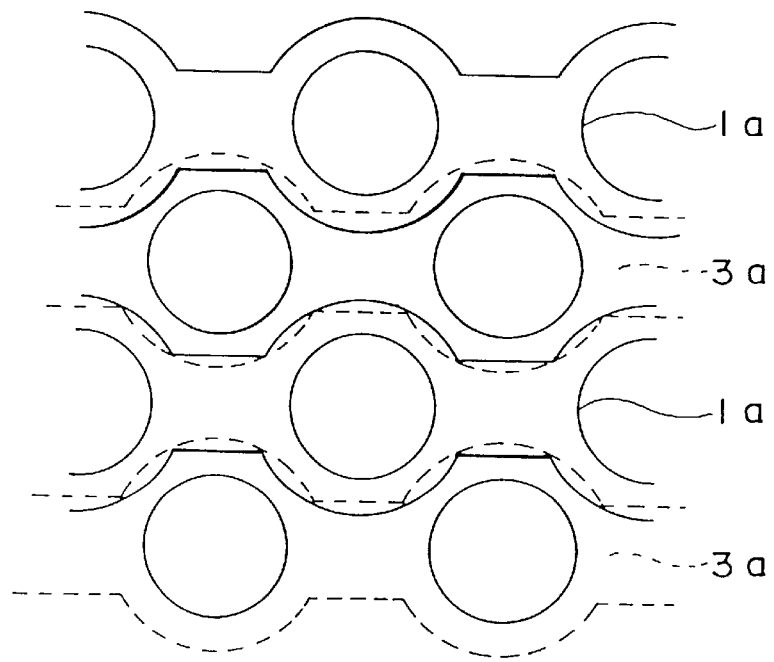
F I G. 9 (b)

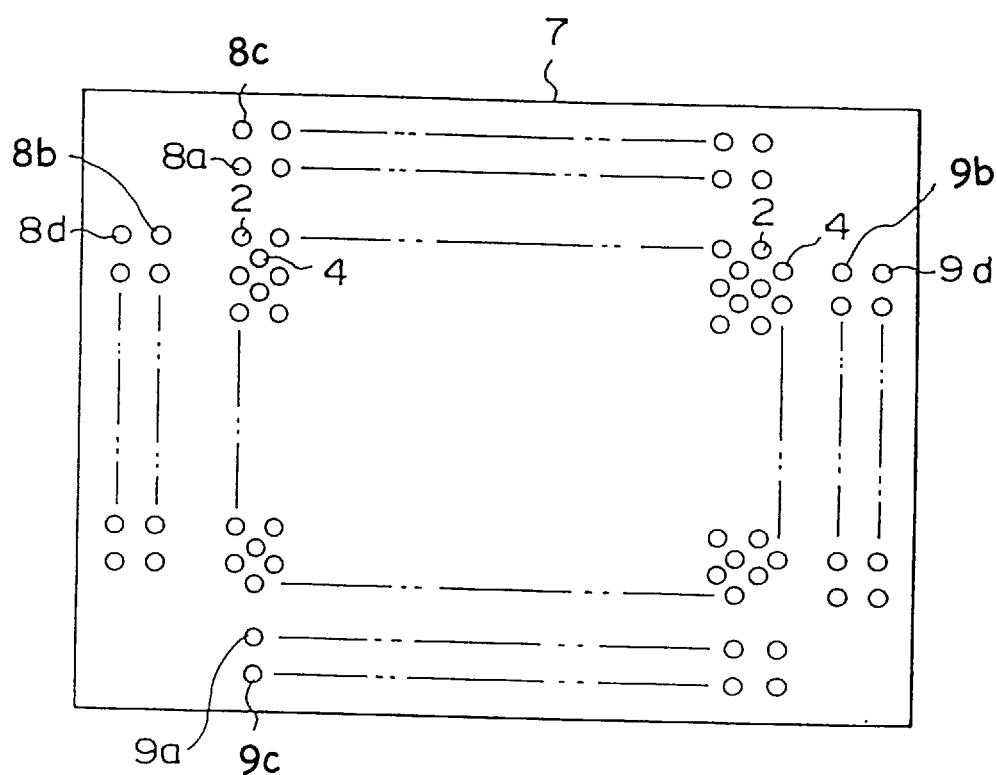
F I G. 10

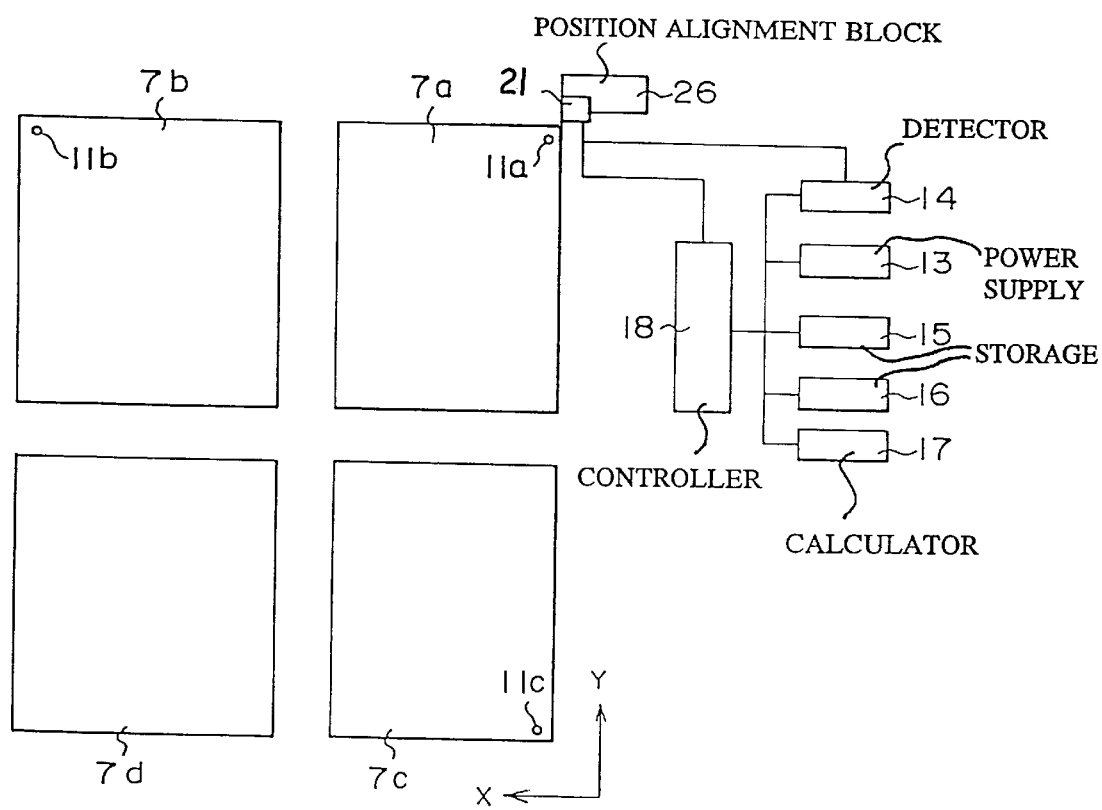
F I G. 11

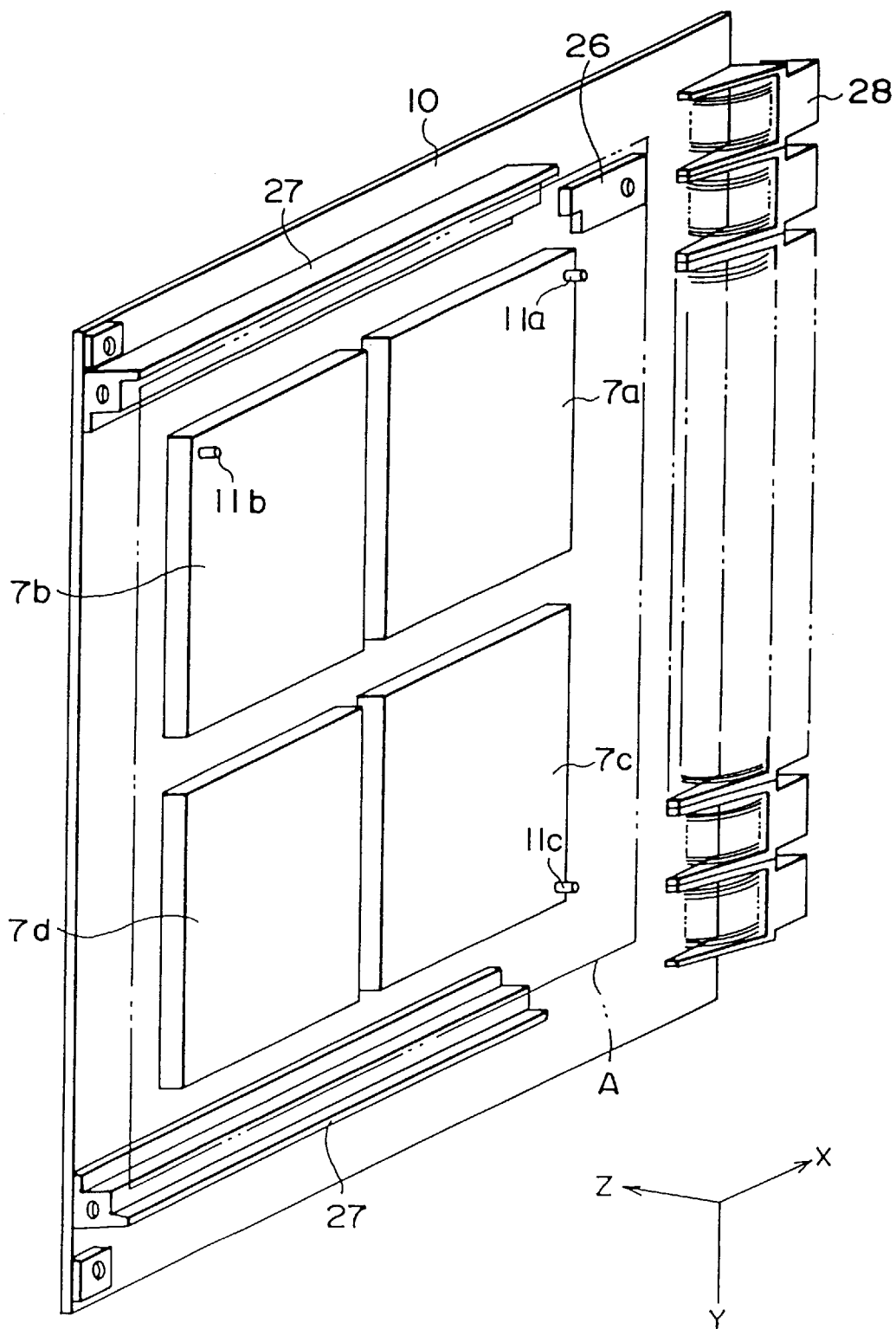
F I G. 12

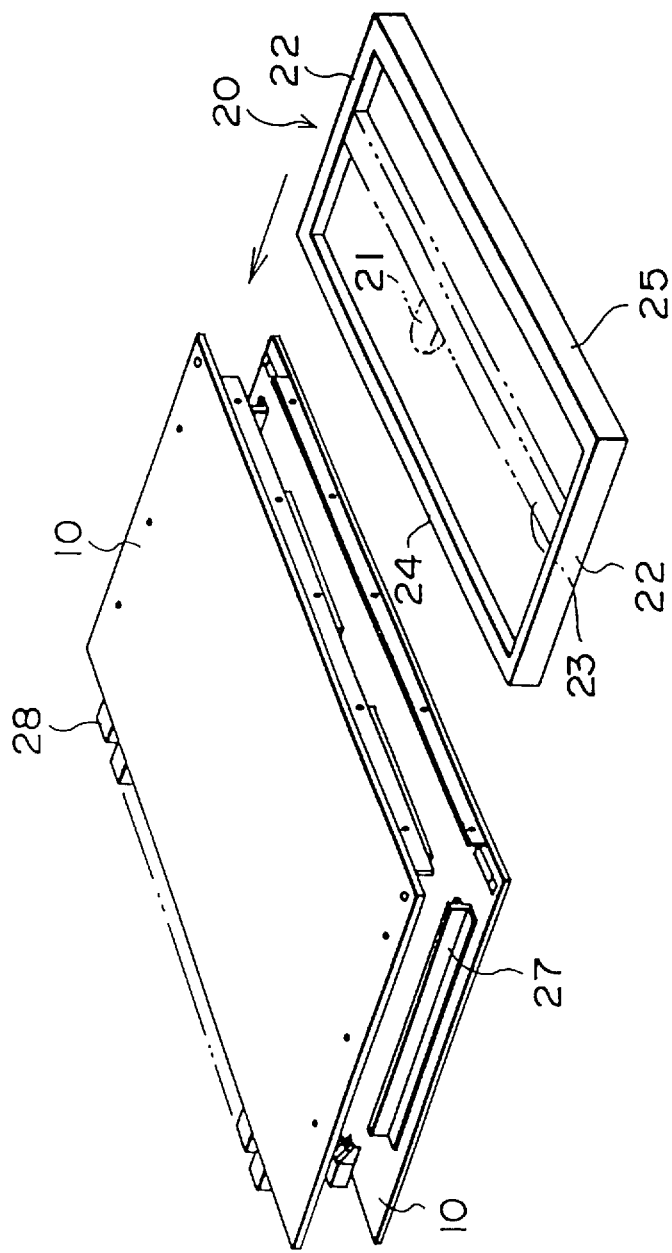
F I G. 13

AUTOMATIC MDF APPARATUS

BACKGROUND OF THE INVENTION

The present invention relates to a main distributing frame (MDF) apparatus, in particular, to an automatic wiring apparatus for causing a robot to perform a jumpering operation of an MDF apparatus that connects an exchange and a subscriber line.

In recent years, various services for telephone communications have been performed as communication networks have grown. The number of subscribers who have such services is increasing year after year. In an exchange, for example, when a telephone subscriber or a user terminal is changed, the connection between the exchange and the user terminal should be removed and changed. Such operations are performed by an MDF apparatus. By inserting or removing a connection pin into/from a particular pin hole of an array on a matrix board, the exchange and the subscriber terminal are connected or disconnected. The inserting operation and removing operation of the connection pins into/from the pin holes on the matrix board of the MDF apparatus are performed by an automatic pin inserting/removing robot from a view point of efficiency.

The matrix board on the MDF apparatus is used for wiring between the subscriber and the exchange between dedicated line networks, between trunk lines, between an exchange and a transmission unit, and so forth. The matrix board is a multiple-layered plate of which a plurality of X axis paired-line patterns and a plurality of Y axis paired-line patterns are alternately formed. Pin holes are formed at all lattice points of which the X axis patterns intersect with the Y axis patterns.

To connect the X axis patterns and the Y axis patterns on the matrix board, a connection pin is inserted into a pin hole formed where an X axis pattern intersect with a Y axis pattern. When many matrix boards and connection pins are used, a large scaled MDF apparatus can be formed.

The automatic pin inserting/removing robot, which inserts or removes a connection pin into/from a pin hole on the matrix board, is composed of a robot hand portion (that holds a connection pin) and a drive mechanism. The automatic pin inserting/removing robot is designed to move in the X axis direction and the Y axis direction on a plane region opposite to many matrix boards. The automatic pin inserting/removing robot inserts or removes a connection pin into/from a pin hole by moving the robot hand portion to a position opposite to the pin hole and inserting the connection pin into the pin hole or removing the connection pin from the pin hole.

However, actually, since many matrix boards are used and/or a large robot hand portion is used for improved reliability of the automatic pin inserting/removing robot, the MDF apparatus itself becomes large.

To solve such a problem, an MDF apparatus in which an automatic pin inserting robot and a plurality of matrix boards are integrated as one unit and a plurality of units are used has been proposed. In this apparatus, each unit has a robot hand portion that moves in the X axis direction and the Y axis direction in a frame corresponding to the plane region opposite to a plurality of matrix boards. In this apparatus, a zero point aligning portion of the robot hand portion is assigned. The apparatus moves the robot hand portion to a desired connection pin or a position opposite to a pin hole corresponding to the zero point position and inserts the connection pin into the pin hole or removes the connection pin from the pin hole.

SUMMARY OF THE INVENTION

Therefore, an object of the present invention is to reduce the size and weight of an MDF apparatus and improve the maintainability thereof without increasing the mounting area of a matrix board disposed thereon.

Another object of the present invention is to accurately align a robot hand portion of an automatic pin inserting/removing robot to a desired connection pin or a position opposite to a pin hole and thereby improve the reliability and maintainability of an MDF apparatus without increasing the mounting area of a matrix board disposed on the MDF apparatus.

A first aspect of the present invention is an automatic MDF apparatus, comprising a plurality of first-staged matrix boards having a plurality of input lines insulated from each other and disposed in the X axis direction and a plurality of output lines insulated from each other and disposed in the Y axis direction, the input lines and the output lines being arranged in a matrix pattern or shape, or a plurality of first-staged printed wiring boards having the first-staged matrix boards, a plurality of second-staged matrix boards having a plurality of input lines insulated from each other and disposed in the X axis direction and a plurality of output lines insulated from each other and disposed in the Y axis direction, the input lines and the output lines being connected in a matrix shape, the second-staged matrix boards being disposed perpendicular to the first-staged matrix boards or the first-staged printed wiring boards, or a plurality of second-staged printed wiring plates having the second-staged matrix boards, a plurality of third-staged matrix boards having a plurality of input lines insulated from each other and disposed in the X axis direction and a plurality of output lines insulated from each other and disposed in the Y axis direction, the input lines and the output lines being arranged in a matrix pattern or shape, the third-staged matrix boards being disposed perpendicular to the second-staged matrix boards or the second-staged printed wiring boards, or a plurality of third-staged printed wiring plates having the third-staged matrix boards, a center board having a common connecting plane disposed between the first-staged matrix boards or the first-staged printed wiring boards and the second-staged matrix boards or the second-staged printed wiring boards and disposed between the second-staged matrix boards or the second-staged printed wiring boards or the second-staged printed wiring boards and the third-staged printed wiring boards, wherein the center board, the first-staged matrix boards, the second-staged matrix board, and the third-staged matrix board or the center board, the first-staged printed wiring board, the second printed wiring board, and the third printed wiring board are connected through connectors.

A second aspect of the present invention is an automatic MDF apparatus having an automatic connection pin inserting/removing robot control unit, comprising a plurality of matrix boards having pin holes into which connection pins are inserted, the pin holes being formed in a matrix shape in the X axis direction and the Y axis direction, a robot hand portion for holding and releasing a connection pin, a zero point position alignment portion disposed at one edge of a moving region of the robot hand portion, a reference pin disposed on a matrix board in the vicinity of the zero point position alignment portion, a measurement pin disposed on a matrix board different from the matrix board having the reference pin, a detecting means for detecting the state that the robot hand portion holds or releases the reference pin and the measurement pin, a first storage means for storing compensation data of the amount of movement of the robot hand portion in the X axis direction, a second storage means for storing compensation data of the amount of movement of the robot hand portion in the Y axis direction, a calculating means for calculating the amount of movement of the robot hand portion, moving the robot hand portion from the zero point position alignment portion in the X axis direction and the Y axis direction, repeating the moving operation of the robot hand portion until the robot hand portion holds the reference pin, and calculating the amount of relative deviation between the robot hand portion and the measurement pin in the X axis direction and the Y axis direction, and a control means for controlling the moving amount of the robot hand portion in the X axis direction and the Y axis direction corresponding to the compensation data stored in the storage means and the second storage means so as to align the robot hand portion to a particular pin hole when the connection pin is inserted or removed into/from the particular pin hole of the matrix board.

BRIEF DESCRIPTION OF THE DRAWING

FIG. 1 is a schematic diagram for explaining a wiring method of matrix boards of an automatic MDF apparatus according to a first embodiment;

FIG. 2 is a schematic diagram showing link connections of three-staged matrix boards shown in FIG. 1;

FIG. 4 is a schematic diagram for explaining a wiring method of matrix boards of an automatic MDF apparatus according to a second embodiment;

FIG. 6 is a schematic diagram for explaining a wiring method of matrix boards of an automatic MDF apparatus according to a modification of the second embodiment;

FIG. 9($a$) is a schematic diagram showing pattern intervals in the case that matrix circuits are disposed on the same plane;

FIG. 9($b$) is a schematic diagram showing pattern intervals in the case that an upper layer of a matrix circuit and an lower layer of another matrix circuit deviate;

FIG. 10 is a plan view showing a matrix board;

FIG. 11 is a schematic diagram showing the structure of an alignment control unit of an automatic pin inserting/removing robot for inserting or removing a connection pin into/from a pin hole of a matrix board of an automatic MDF apparatus;

FIG. 12 is a perspective view showing an array of the matrix board shown in FIG. 11;

FIG. 13 is a perspective view showing an example of which an automatic pin inserting/removing robot is mounted.

DESCRIPTION OF THE PREFERRED EMBODIMENTS

Figure 3:
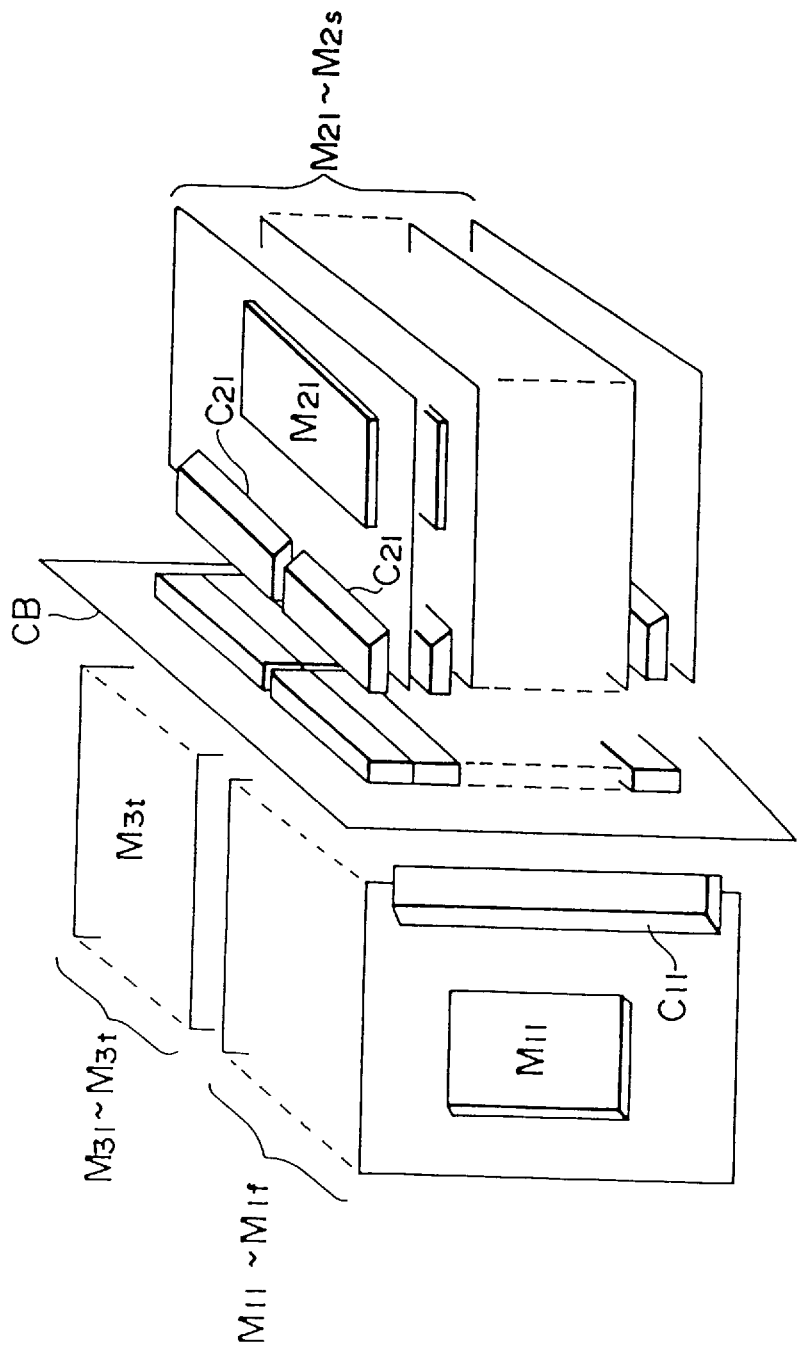
FIG. 3 is a schematic diagram showing connectors for connecting a plurality of matrix boards of each stage.

Next, with reference to the accompanying drawings, preferred embodiments of the present invention will be described. FIG. 1 is a schematic diagram for explaining a wiring board of matrix boards of an automatic MDF apparatus according to a first embodiment. For simplicity, a method for connecting three-staged matrix boards will be described.

In FIG. 1, matrix boards of an automatic MDF apparatus according to the first embodiment are composed of a first-staged matrix board block, a second-staged matrix board block, and a third-staged matrix board block. The first-staged matrix board block is composed of f matrix boards M11 to M1f. The second-staged matrix board block is composed of s matrix boards M21 to M2s. The third-staged matrix board block is composed of t matrix boards M31 to M3t. Each of the matrix boards has an input line block and an output line block. The input line block is composed of a plurality of input lines. The output line block is composed of a plurality of output lines. The first-staged matrix board block (M11 to M1f) is vertically disposed. Output lines of the first-staged matrix board block are disposed on a center board (CB)side. The center board (CB)has connectors (as will be described later). The second-staged matrix board block (M21 to M2s) is disposed in perpendicular to the first-staged matrix board block (M11 to M1f) through the center board. Input lines and output lines of the second-staged matrix board block are disposed on the center board side. The third-staged matrix board block (M31 to M3t) is disposed in perpendicular to the second-staged matrix board block (M21 to M2s) through the center board. Input lines of the third-staged matrix board block (M31 to M3t) are disposed on the center board side.

The output lines of the first-staged matrix board block (M11 to M1f) are connected to the input lines of the second-staged matrix board block (M21 to M2s) through the center board. The output lines of the second-staged matrix board block (M21 to M2s) are connected to the input lines of the third-staged matrix board block (M31 to M3t) through the center board. Thus, the output lines of the first-staged matrix board block (M11 to M1f) and the input lines of the third-staged matrix board block (M31 to M3t) are disposed on the center board side. The input side and the output side of the second-staged matrix board block (M21 to M2s) are disposed on the same side of the center board.

Thus, the center board is disposed on a common connecting surface between the first-staged matrix board block (M11 to M1f) and the second-staged matrix board block (M21 to M2s) and between the second matrix board block (M21 to M2s) and the third-staged matrix board (M31 to M3t).

The input lines of the first-staged matrix board (M11 to M1f) are connected to for example subscriber terminals of telephone subscribers.

The output lines of the third-staged matrix board (M31 to M3t) are connected to for example a downstream external unit or an exchange.

FIG. 2 is a schematic diagram showing link connections of the three-staged matrix boards shown in FIG. 1.

In FIG. 2, as with the structure shown in FIG. 1, the matrix boards are composed of f matrix boards M11 to M1f, s matrix boards M21 to M2s, and t matrix boards M31 to M3t. The matrix boards are link-connected in a net shaped. Thus, the output lines of the individual matrix boards of each stage are connected to the input lines of the matrix boards of the next stages At connections between the first-staged matrix boards M11 to M1f and the second-staged matrix boards M21 to M2s, for example the first-staged matrix boards M11 to M1f have a plurality of input lines and a plurality of output lines. The output lines of the matrix board M11 are connected to the input lines of the second-staged matrix boards M21 to M2s through the center board. The output lines of the matrix board M12 are connected to the input lines of the second-staged matrix boards M21 to M2s. The number of output lines of each matrix board of each stage is the same as the number of input lines of each matrix board of the next stage.

The input lines of the second-staged matrix board M21 are connected to the output lines of the first-staged matrix boards M11 to M1f through the center board. The input lines of the second-staged matrix board M22 are connected to the output lines of the first-staged matrix boards M11 to M1f through the center board.

At the connections between the second-staged matrix boards M21 to M2s and the third-staged matrix boards M31 to M3t, for example the second-staged matrix boards M21 to M2s have a plurality of output lines. The output lines of the matrix board M21 are connected to the input lines of the third-staged matrix boards M31 to M3t through the center board. The output lines of the matrix board M22 are connected to the input lines of the third-staged matrix boards M31 to M3t through the center board. Thus, the input lines of the third-staged matrix board M31 are connected to the output lines of the second-staged matrix boards M21 to M2s through the center board. The input lines of the third-staged matrix board M32 are connected to the output lines of the second-staged matrix boards M21 to M2t through the center board.

FIG. 3 shows connectors for connecting a plurality of matrix boards of each stage.

Connectors C11 to C1f are disposed on the output line side of the matrix boards M11 to M1f. The connectors C11 to C1f accommodate the output line blocks of the matrix boards M11 to M1f. Connectors C21 to C2s are disposed on the center board side of the matrix boards M21 to M2s. The connectors C21 to C2s accommodate the input line blocks and the output line blocks of the matrix boards M21 to M2s. Connectors C31 to C3t (not shown) are disposed on the input line side of the matrix boards M31 to M3t. The connectors C31 to C3t accommodate the input line blocks of the matrix boards M31 to M3t.

The center board (CB) has connectors that perpendicularly connect the connectors C11 to C1f of the matrix boards M11 to M1f and the connectors C21 to C2s of the matrix boards M21 to M2s. In addition, the center board has connectors that perpendicularly connect the connectors C21 to C2s of the matrix boards M21 to M2s and the connectors C31 to C3t of the matrix boards M31 to M3t. Thus, lines of a plurality of matrix boards of each stage (namely, the matrix boards M11 to M1f, the matrix boards M21 to M2s, and the matrix boards M31 to M3t) are link-connected.

Thus, according to the first embodiment, the first-staged matrix boards and the second-staged matrix boards can be perpendicularly disposed through the center board and connected with the connectors. Likewise, the second-staged matrix boards and the third-staged matrix boards can be perpendicularly disposed through the center board and connected with the connectors. In other words, odd-staged matrix boards and even-staged matrix boards can be perpendicularly disposed through the center board and connected with the connectors.

Thus, cables for link-connecting matrix boards of each stage are omitted, thereby reducing the size and cost of the automatic MDF apparatus.

FIG. 4 is a schematic diagram for explaining a wiring method of matrix boards of an automatic MDF apparatus according to a second embodiment. As with the first embodiment, a method for connecting three-staged matrix boards will be described.

For simplicity, in FIG. 4, similar portions to those in FIG. 1 are denoted by similar reference numerals.

In the second embodiment, for example eight first-staged matrix boards M11 to M1f are mounted on each printed wiring board PB1. Eight second-staged matrix boards M21 to M2s are mounted on each printed wiring board PB2. Eight third-staged matrix boards M31 to M3t are mounted on each printed wiring board PB3. Each printed wiring board PB1 and each printed wiring board PB2 are perpendicularly disposed through the center board. Each printed wiring board PB2 and each printed wiring board PB3 are perpendicularly disposed through the center board.

A plurality of output connectors C1o are disposed at an end portion on the center board side of each printed wiring board PB1. Each connector C1o distributively accommodates the output lines of the matrix boards M11 to M1f disposed on the printed wiring board PB1. The uppermost connector C1o of the printed wiring board PB1 that mounts the matrix boards M11 to M18 connects uppermost eight lines of the matrix boards M11 to M18.

Each printed wiring board PB1 is a multiple-layered printed wiring board. The output lines of the matrix boards M11 to M18 are connected to the connector C1o through the multiple-layered printed wiring board PB1.

Likewise, a predetermined number of output lines of the matrix board Ml(8n+1) to M1(8n+8) (where n=1, 2, . . . ) are connected to another connector C1o. Thus, 8×8 output lines of the matrix boards M11 to M18 are connected to the uppermost connector C1o of the printed wiring board PB1.

A plurality of input connectors C2i and a plurality of output connectors C2o are disposed at an end portion on the center board side of each printed wiring board PB2. Each connector C2i distributively accommodates input lines of the matrix boards M21 to M2s disposed on the printed wiring board PB2. Likewise, each connector C2i distributively accommodates output lines of the matrix boards M21 to M2s disposed on the printed wiring board PB2. In other words, the connector C2i and C2o distributively accommodate the input lines and the output lines of the matrix boards M21 to M2s disposed on the printed wiring board PB2, respectively. For example, uppermost eight input lines of each of the matrix boards M21 to M28 are connected to the uppermost connector C2i of the printed wiring board PB2 that mounts the matrix boards M21 to M28. As with each printed wiring board PB1, each printed wiring board PB2 is a multiple-layered printed wiring board. The input lines of the matrix boards M21 to M28 are connected to the connector C2i through the multiple-layered printed wiring board PB2. Thus, 8×8 input lines of the matrix boards M21 to M28 are connected to the uppermost connector C2i of the printed wiring board PB2.

A plurality of input connectors C3i are disposed at an end portion on the center board side of each printed wiring board PB3. Each connector C3i distributively accommodates the input lines to the matrix boards M31 to M3t disposed on the printed wiring board PB3. For example, uppermost eight input lines to the matrix boards M31 to M38 are connected to the uppermost connector C3i of the printed wiring board PB3 that mounts the matrix boards M31 to M38. As with the printed wiring boards PB1 and PB2, the printed wiring board PB3 is a multiple-layered printed wiring board. The input lines of the matrix boards M31 to M38 are connected to the connector C3i through the multiple-layered printed wiring board PB3.

Thus, 8×8 input lines of the matrix boards M31 to M38 are connected to the uppermost connector C3i of the printed wiring board PB3. In other words, each connector C3i distributively accommodates input lines corresponding to the position of each printed wiring board PB2 to be connected. For example, press fit pins are disposed on the center board at positions of which the center board is perpendicular to the printed wiring boards PB1 to PB3. The press fit pins press the connectors C1o, C2i, C2o, and C3i disposed on the printed wiring boards PB1 to PB3. The press fit pins are disposed on the center board at positions corresponding to the connectors C1o, C2i, C2o, and C3i disposed on the printed wiring boards PB1 to PB3. When the connectors C1o, C2i, C2o, and C3i disposed on the printed wiring boards PB1 to PB3 are press-fitted to the press fit pins, the lines of the three-staged matrix boards (namely, the matrix boards M11 to M1f, M21 to M2s, and M31 to M3t) are link-connected.

Thus, according to the second embodiment, since a predetermined number of matrix boards at each stage is disposed on the same printed wiring board and connected, the size of the automatic MDF apparatus can be reduced.

Figure 5:
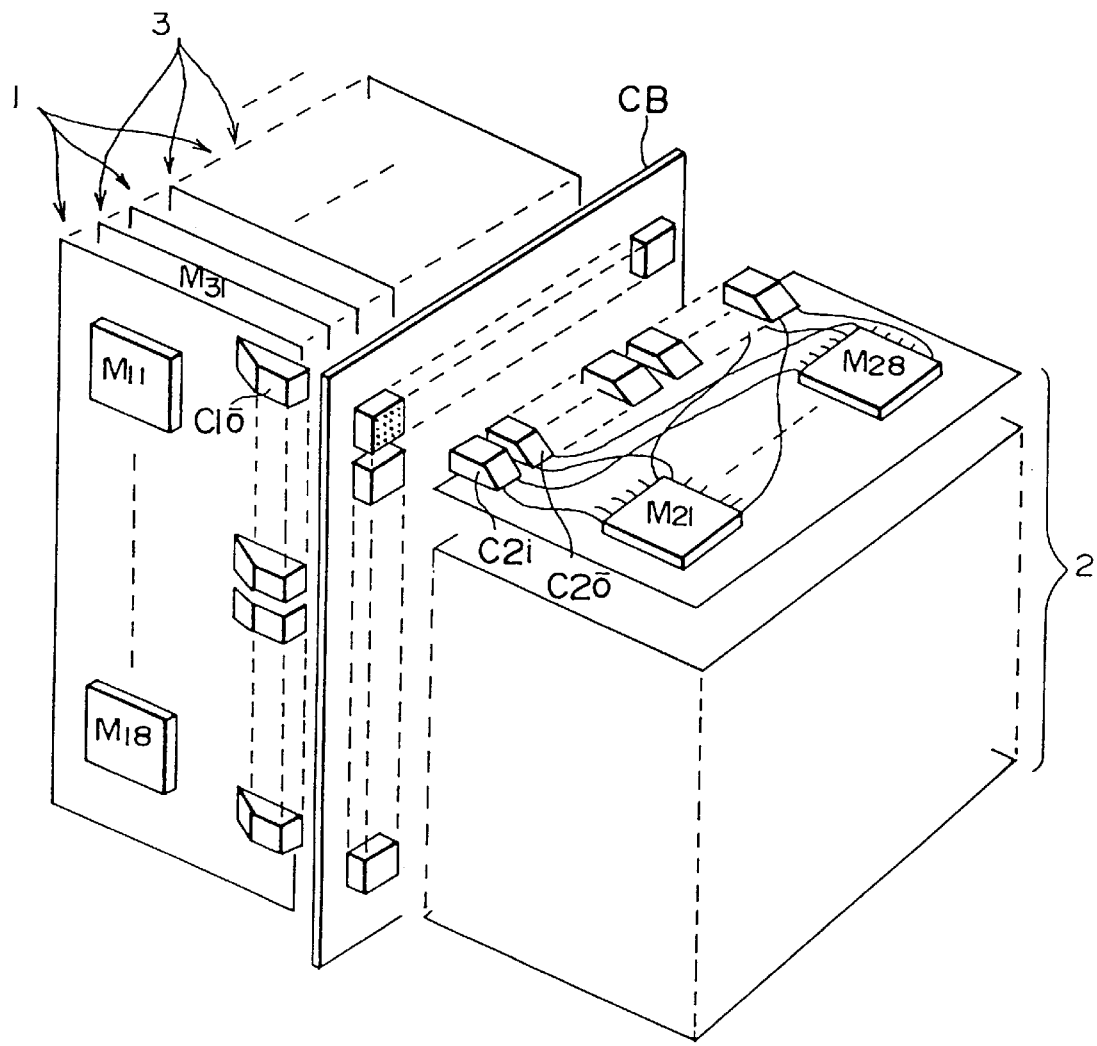
FIG. 5 is a schematic diagram for explaining a wiring method of matrix boards of an automatic MDF apparatus according to a modification of the first embodiment.

FIG. 5 is a schematic diagram for explaining a wiring method of matrix boards of an automatic MDF apparatus according to a modification of the first embodiment. In this modification, a method for connecting three-staged matrix boards will be described.

For simplicity, in FIG. 5, similar portion to those in FIGS. 1 and 4 are denoted by similar reference numerals.

In this modification, printed wiring boards PB1 and printed wiring boards PB3 are alternately disposed. First-staged matrix boards M11 to M1f are disposed on each of the printed wiring boards PB1. Third-staged matrix boards M31 to M3f are disposed on each of the printed wiring boards PB3. Printed wiring boards PB2 are disposed perpendicular to the printed wiring boards PB1 and PB3. Each of the printed wiring board PB2 mount second-staged matrix boards M21 to M2s. Connectors C2i and C2o are alternately disposed on each of the printed wiring board PB2 through the center board corresponding to the printed wiring boards PB1 and PB2.

FIG. 6 is a schematic diagram for explaining a wiring method of matrix boards of an automatic MDF apparatus according to a modification of the second embodiment. In this modification, a method for connecting three-staged matrix boards will be described.

For simplicity, in FIG. 6, similar portions to those in FIGS. 1 and 4 are denoted by similar reference numerals.

In this modification, for example four first-staged matrix boards M11 to M1f and four third-staged matrix boards M31 to M3t are mounted on the same printed wiring board PB4. Connectors C1o,31i are disposed at an end portion on the center board side of the printed wiring board PB4. Each connector C1o,31i accommodates the uppermost four output lines of the first-staged matrix boards M11 to M14 and the uppermost four input lines of the third-staged matrix boards M31 to M34.

For example, four second-staged matrix boards M21 to M2s are disposed on the same printed wiring board PB5. Input/output line connectors C2io corresponding to the connectors C1o,31i mounted on the printed wiring board PB4 are disposed at an end portion on the center board side of the printed wiring board PB5.

Each printed wiring board PB4 and each printed wiring board PB5 are perpendicularly disposed through the center board. The link connections of each printed wiring board and each printed wiring board PB5 are the same as the link connections of the above-described second embodiment.

Figure 7:
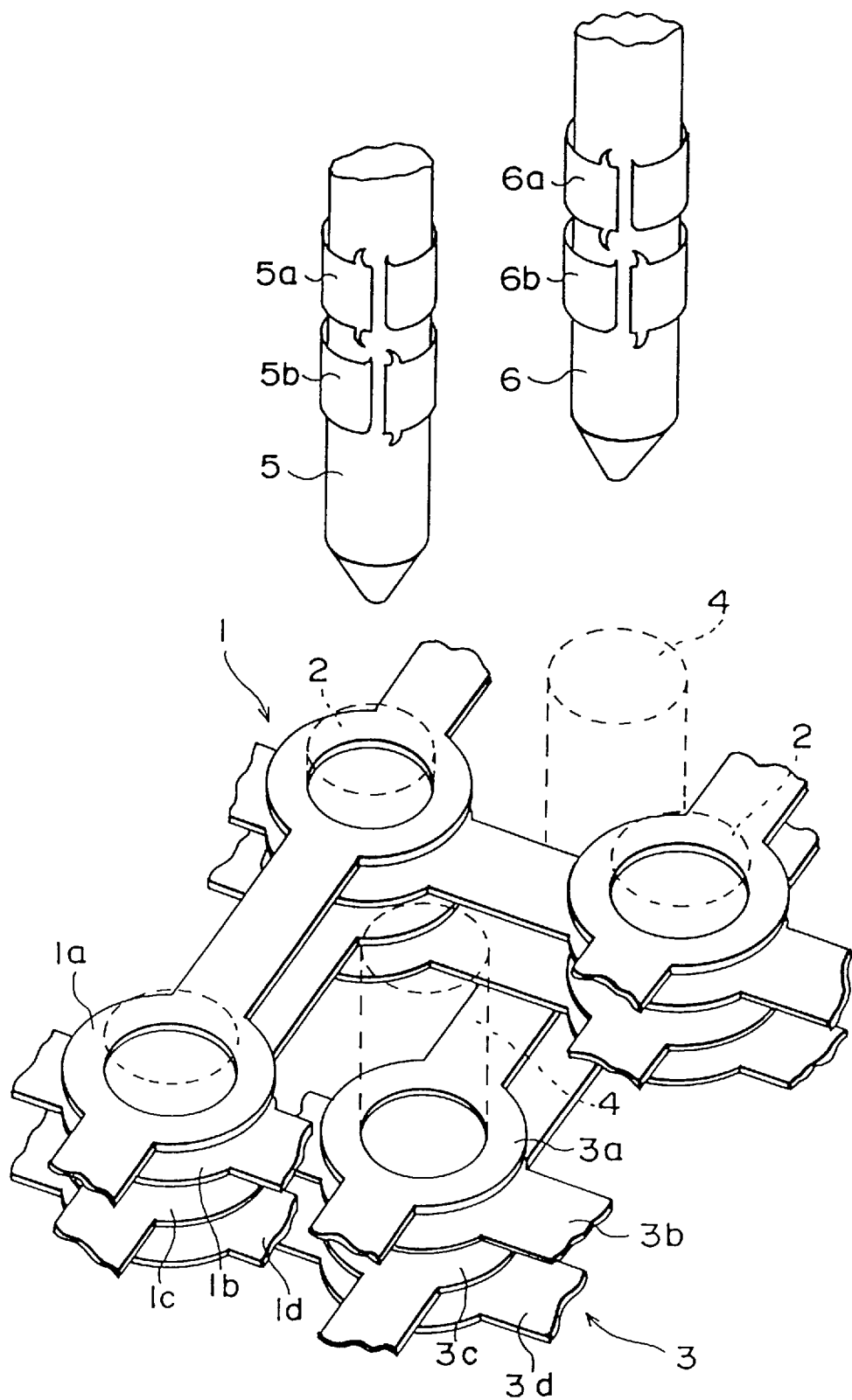
FIG. 7 is a partial perspective view showing the structure of a matrix board of an automatic MDF apparatus.

FIG. 7 is a partial perspective view showing a structure of a matrix board of an automatic MDF apparatus.

In FIG. 7, reference numeral 1a is one of a plurality of first-layered patterns equally formed in the X axis direction. Reference numeral 1b is one of a plurality of second-layered patterns equally formed in the Y axis direction. Reference numeral 1c is one of a plurality of third-layered patterns equally formed in the X axis direction. Reference numeral 1d is one of a plurality of fourth-layered patterns equally formed in the Y axis direction. The pattern 1a and pattern 1c are input lines. The pattern 1b and pattern 1d are output lines. The pattern 1a and the pattern 1c overlay. The pattern 1b and pattern 1d overlay. The pattern 1a to pattern 1d are disposed in the direction of the thickness of the matrix board at predetermined intervals, A pin hole 2 is formed from the intersection of the pattern 1a and pattern 1b to the intersection of the pattern 1c and pattern 1d. Thus, the pin hole 2 is formed at the intersection of each of the pattern 1a to pattern 1d. The pattern 1a to pattern 1d are exposed to the inner surface of the pin hole 2. Each of the pattern 1a to pattern 1d is insulated. The pattern 1a to pattern 1d and the pin hole 2 structure a matrix circuit 1.

Reference numeral 3a is one of a plurality of fifth-layered patterns equally formed in the X axis direction. Reference numeral 3b is one of a plurality of sixth-layered patterns equally formed in the Y axis direction. Reference numeral 3c is one of a plurality of seventh-layered patterns equally formed in the X axis direction. Reference numeral 3d is one of a plurality of eighth-layered patterns equally formed in the Y axis direction. The pattern 3a and 3c are input lines. The pattern 3b and pattern 3d are output lines. The pattern 3a and pattern 3c overlay. The pattern 3b and pattern 3d overlay. The pattern 3a to pattern 3d are formed in the direction of the thickness of the matrix board at predetermined intervals.

A pin hole 4 is formed from the intersection of the pattern 3a and pattern 3b to the intersection of the pattern 3c and pattern 3d. The pin hole 4 is formed at the intersection of the pattern 3a to pattern 3d. The pattern 3a to pattern 3d are exposed to the inner surface of the pin hole 4. Each of the pattern 3a to pattern 3d is insulated. The pattern 3a to pattern 3d and the pin hole 4 structure a matrix circuit 3.

The matrix circuit 1 as the upper layer and the matrix circuit 3 as the lower layer structure a matrix board of the automatic MDF apparatus.

The position of the pin hole 4 of the lower-layered matrix circuit 3 structured of the patterns 3a to 3d and the pin hole 4 deviates from the position of the pin hole 2 of the upper-layered matrix circuit 1 structured of the patterns 1a to 1d and the pin hole 2 by a half lattice. In other words, each pin hole 4 of the matrix circuit 3 is formed at the center of a square with four vertexes corresponding to the four adjacent pin holes of the matrix circuit 1.

A connection pin 6 is a connection pin inserted into the pin hole 2. The connection pin 5 has a connection terminal 5a and a connection terminal 5b. The connection terminal 5a electrically connects the patterns 1a and 1b. The connection terminal 5b is insulated from the connection terminal 5a and electrically connects the patterns 1c and 1d. Thus, the connection terminal 5a has a length with which the patterns 1a and 1b are electrically connected. In addition, the connection terminal 5b has a length with which the patterns 3c and 1d are electrically connected. A connection pin 6 is a connection pin inserted into the pin hole 4. The connection pin 6 has a connection terminal 6a and a connection terminal 6b. The connection terminal 6a electrically connects the patterns 3a and 3b. The connection terminal 6b is insulated from the connection terminal 6a and electrically connects the patterns 3c and 3d. Thus, the connection terminal 6a has a length with which the patterns 3a and 3b are electrically connected. in addition, the connection terminal 6b has a length with which the patterns 3c and 3d are electrically connected.

In other words, the connection terminal 5a, the connection terminal 5b, the connection terminal 6a, and the connection terminal 6b electrically connect the relevant upper and lower layer patterns.

Figure 8:
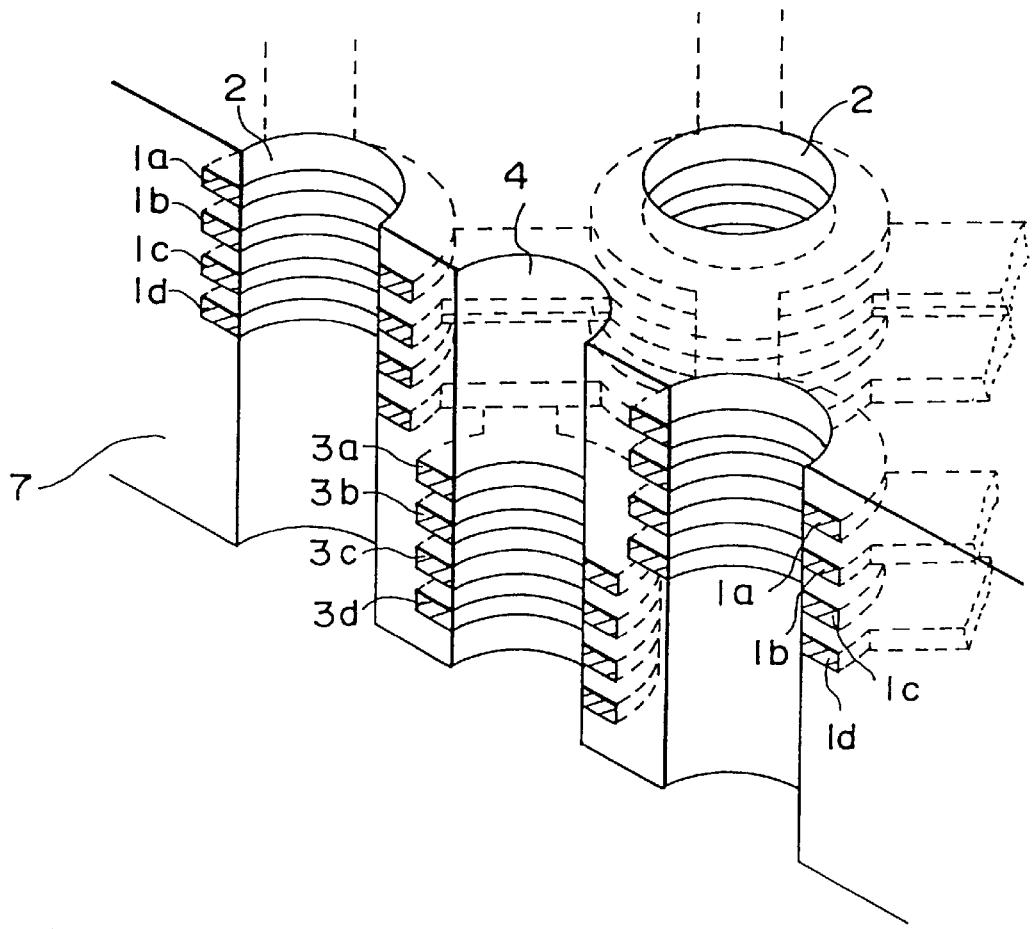
FIG. 8 is an exploded perspective view showing principal portions of a matrix board.

FIG. 8 is an exploded perspective view showing principal portions of a matrix board.

The matrix board 7 is a multiple-layered board having layers with patterns alternately layered so as to insulate each pattern. The matrix board 7 comprises the matrix circuit 1 composed of upper four layers of the patterns 1a to 1d and the pin hole 2 shown in FIG. 6 and the matrix circuit 3 composed of lower four layers of the patterns 3a to 3d and the pin hole 4 shown in FIG. 6. The pin hole 2 and the pin hole 4 pass through the matrix board 7. in the matrix circuit 1 of the matrix board 7, when the connection pin 5 is inserted into a particular pin hole 2, the pattens 1a and 1b are electrically connected by the connection terminal 5a. In addition, the patterns 1c and 1d are electrically connected by the connection terminal 5b. Thus, a particular electric path is formed. On the other hand, in the matrix circuit 3 of the matrix board 7, when the connection pin 6 is inserted into a particular pin hole, the pattern 3a and pattern 3b are electrically connected by the connection terminal 6a. In addition, the pattern 3c and pattern 3d are electrically connected by the connection terminal 6b. Thus, a particular electric path is formed. As described above, in the matrix board 7, the position of the pin hole 4 deviates from the position of the pin hole 2 by a half lattice. Consequently, in the matrix board, the pattern of the matrix circuit 1 and the pattern of the matrix circuit 3 are formed on the different planes in both the X axis direction and the Y axis direction. Thus, the matrix circuit 1 and the matrix circuit 3 can be disposed as upper and lower circuits with a deviation. Consequently, in the matrix board 7, the insulation of each pattern can be improved. Thus, a high density matrix board can be accomplished with a small area.

Next, a method for disposing the matrix circuit 1 and the matrix circuit 3 as upper and lower circuits with a deviation will be described.

FIGS. 9(a) and 9(b) are plan views showing principal portions of the matrix board 7. FIG. 9(a) shows intervals of patterns of the matrix circuit 1 and the matrix circuit 3 formed on the same plane. FIG. 9(b) shows intervals of patterns of the matrix circuit 1 and the matrix circuit 3 as upper and lower layers with a deviation. In FIGS. 9(a) and 9(b), only patterns 1a and 3a of the patterns in the X axis direction are shown. This applies to the pair of patterns 1a and 3a in the X axis direction, the pair of patterns 1b and 3b in the Y axis direction, and the pair of patterns 1d and 3d in the Y axis direction. The parallel patterns formed on the same plane are insulated and spaced by a length of which an electric leakage does not take place.

In the case that the matrix circuit 1 and matrix circuit 3 are disposed in one matrix board 7, it is assumed that patterns in the X axis direction are formed on the same plane. In addition, it is assumed that patterns in the Y axis direction are formed on the same plane. In FIG. 9(a), the pattern 3a of one matrix circuit should be formed between the patterns 1a of the other matrix circuit. Thus, in FIG. 9(a), the intervals of the patterns 1a and the intervals of the patterns 3a should be large so that the adjacent patterns are insulated and an electric leakage does not take place between the adjacent patterns.

On the other hand, in FIG. 9(b), each pin hole 4 of the matrix circuit 3 is formed at the center of a square having four vertexes corresponding to four adjacent pin holes 2 of the matrix circuit 1. The patterns in the X axis direction of the matrix circuit 1 and the matrix circuit 3 are formed on the different planes. In addition, the patterns in the Y axis direction are formed on the different planes. To dispose the matrix circuit 1 and the matrix circuit 3 as upper and lower layers with a deviation, a pattern 3a of one matrix circuit is not formed between patterns 1a of the other circuit. Thus, in FIG. 9(b), the intervals of adjacent patterns 1a and the intervals of adjacent patterns 3a can be narrowed.

The matrix board 7 is applied for an automatic MDF apparatus with an automatic pin inserting/removing robot that inserts or removes a connection pin into/from a pin hole of the matrix board so as to perform a jumpering operation. The automatic pin inserting/removing has a robot hand portion that moves in the X axis direction and the Y axis direction. The robot hand portion moves to the position of a particular pin hole 2 or a particular pin hole 4 and inserts/removes the connection pin 5 or 6. Thus, when the area of the matrix board 7 narrows, the moving amount of the automatic pin inserting/removing robot decreases. When the moving amount of the automatic pin inserting/removing robot increases, the time for moving the automatic pin inserting/removing robot increases. To suppress the increase of the moving time, the moving speed of the automatic pin inserting/removing robot should be increased. However, when the moving speed of the automatic pin inserting/removing robot increases, the time for stopping the automatic pin inserting/removing robot increases. Thus, a means for suppressing the time for stopping the automatic pin inserting/removing robot is required.

When the moving amount of the automatic pin inserting/removing robot decreases, the moving time of the automatic pin inserting/removing robot can be decreased without need to increase the moving speed thereof. As with the matrix board 7, when the matrix circuit 1 and the matrix circuit 3 are structured in one matrix board in such a manner that the pin holes of the upper layer and the lower layer are formed with a deviation. Thus, the area of the matrix board can be narrowed. Consequently, with the matrix board 7, the size of the automatic MDF apparatus can be reduced. As a result, the size and cost of the automatic pin inserting/removing robot can be further reduced.

FIG. 10 is a plan view of the matrix board 7.

In FIG. 10, pin holes 4 are formed on the front surface of the matrix board 7. Each pin hole 4 is formed at the center of a square having four vertexes corresponding to four adjacent pin holes 2.

In FIG. 10, reference numeral 8a is an input terminal connected to the pattern 1a. Reference numeral 8c is an input terminal connected to the pattern 1c. Reference numeral 9a is an input terminal connected to the pattern 3a. Reference numeral 9c is an input terminal connected to the pattern 3c. The input terminals 8a and 8c corresponding to the matrix circuit 1 that is the upper layer of the matrix board 7 and the input terminals 9a and 9c corresponding to the matrix circuit 3 that is the lower layer of the matrix board 7 are disposed on two sides of the matrix board 7 and on the two sides opposite thereto, respectively. Reference numeral 8b is an output terminal connected to the pattern 1b. Reference numeral 8d is an output terminal connected to the pattern 1d. Reference numeral 9b is an output terminal connected to the pattern 3b. Reference numeral 9d is an output terminal connected to the pattern 3d. The output terminals 8b and 8d corresponding to the matrix circuit 1 that is the upper layer of the matrix board 7 and the output terminals 9b and 9d corresponding to the matrix circuit 3 that is the lower layer of the matrix board 7 are disposed on two sides of the matrix board 7 and the other two sides opposite thereto, respectively, the input terminals 8a to 8d being not disposed on the opposite two sides. Thus, the input terminals 8a to 8d and the output terminals 9a to 9d are disposed on the four sides of the matrix board 7.

Consequently, with the input terminals 8a to 8d and the output terminals 9a to 9d, the intervals of the individual terminals can be widened. This feature is very effective for reducing the number of layers of printed wiring boards so as to accomplish multiple-layered patterns formed between the MB and connectors thereon.

FIG. 11 is a schematic diagram showing the structure of a position alignment control unit for use with an automatic pin inserting/removing robot that inserts/removes a connection pin into/from a pin hole of a matrix board of an automatic MDF apparatus. FIG. 12 is a perspective view showing an array of matrix boards shown in FIG. 11.

In FIGS. 11 and 12, reference numerals 7a to 7d are matrix boards. Reference numeral 10 is a mother board that has the matrix boards 7a to 7d. The matrix boards 7a to 7d are soldered to the mother board 10. For simplicity, the mother board 10 has four matrix boards 7a to 7d that are disposed in the X axis direction and the Y axis direction.

The matrix boards 7a to 7d have many pin holes 2 and pin holes 4 that are formed in a particular array shape. When the connection pins 5 and 6 shown in FIG. 7 are inserted into the pin holes 2 and 4, conductors of the matrix boards 7a to 7d are electrically connected. Thus, an exchange and a user terminal is connected. When a connection pin is removed from a pin hole on the matrix board 7a to 7d, the connections of conductors (not shown) on the matrix board 7a to 7d are removed. Thus, the connection of the exchange and the user terminal is removed.

Reference numeral 26 is a zero point position alignment block for aligning the zero point position of an automatic pin inserting/removing robot that inserts or removes a connection pin into/from a pin hole of the matrix boards 7a to 7d. The zero point position alignment block 26 is disposed in the vicinity of an outer corner portion of the matrix board 7a. For details, as shown in FIG. 12, the zero point position alignment block 26 is secured at one corner of an area A denoted by two-dotted lines. Reference numeral 11a is a reference pin disposed in the vicinity of the zero point position alignment block 26 and in the vicinity of the outer corner portion of the matrix board 7a. In the reference pin 11a, at least a portion held by the robot hand portion of the automatic pin inserting/removing robot is composed of a conductor or a conductor is disposed at the portion. Reference numeral 11b is a measurement pin disposed in the vicinity of the outer corner portion of the matrix board 7b adjacent to the matrix board 7a in the X axis direction. The structure of the measuring pin 11b is the same as the structure of the reference pin 7a. Reference numeral 11c is a measurement pin disposed in the vicinity of the outer corner portion of the matrix board 7c adjacent to the matrix board 7a in the Y axis direction. The structure of the measurement pin 11c is the same as the structure of the reference pin 7a.

The reference pin 11a, the measurement pin 11b, and the measurement pin 11c are accurately secured to the pin holes of the matrix boards 7a, 7b, and 7c in such a manner that predetermined distances thereof are obtained. The zero point position alignment block 26 is secured to a position very close to the reference pin 11a. Thus, the position of the zero point position alignment block 26 can be slightly adjusted. The mounting error does not substantially take place between the reference pin 11a and the zero point position alignment block 26.

FIG. 13 is a perspective view showing an example of now an automatic pin inserting/removing robot is mounted.

A mounting example of the automatic pin inserting/removing robot will be described with reference to FIG. 12 along with FIG. 13. Reference numeral 27 is one of guide rails disposed along two opposite sides of the mother board 27. Reference numeral 28 is one of connectors disposed on a rear end of the mother board 10. The matrix boards 7a to 7d are electrically connected to a matrix board disposed on another mother board or an external unit by the connector 28.

Reference numeral 20 is an automatic pin inserting/removing robot that inserts/removes a connection pin into/from a matrix board on the automatic MDF apparatus. The automatic pin inserting/removing robot 20 is composed of a square shaped outer portion, a Y frame 23, and a robot hand portion. The outer portion is composed of a pair of X frames 22, a connection frame 24, and a front plate 25. The Y frame 23 is disposed between the X frames 22. The robot hand portion has a pair of holding portions that are disposed on the Y frame and that can be opened.

The Y frame 23 is moved in the X axis direction along the X frames by an X axis motor and its motion transmission mechanism (not shown) disposed on one of the X frames 22. At this point, the robot hand portion 21 is moved in the X axis direction along with the Y frame.

The robot hand portion 21 is moved in the Y axis direction along the Y frame 23 by a Y axis motor and its motion transmission mechanism (now shown) disposed on the Y frame 22. Thus, the robot hand portion 21 can be freely moved in the X axis direction and Y axis direction in a rectangular plane region defined by the outer portion composed of the X frame 22, the connection frame 24, and the front plate 25.

The robot hand portion 21 has a Z axis motor, its motion transmission mechanism, and a Z guide. Thus, the robot hand portion 21 can be also moved in the Z axis direction. In addition, the robot hand portion 21 has an open/close motor that holds or releases a connection pin.

The motors of individual axes and open/close motor of the robot hand portion are stepping motors.

Next, with reference to FIG. 11, a moving control means of the robot hand portion 21 through the motors of the individual axes will be described.

Referring to FIG. 11, the moving control means of the robot hand portion 21 shown in FIG. 12 comprises a power supply 13, a detector or detecting circuit 14, a first storage portion 15 that stores the amount of deviation in the X axis direction of the measurement pin 11b of the matrix board 7b, a second storage portion 16 that stores the amount of deviation in the X axis direction of the measurement pin 11c of the matrix board 7c, a calculator or calculating portion 17 that calculates the amount of compensation for which the robot hand portion 21 is moved, and a controller or control portion 18 that totally controls the power supply 13, the detecting circuit 14, the first storage portion 15, the second storage portion 16, and the calculating portion 17 and drives the motors of the individual motors.

The automatic pin inserting/removing robot 20 having the robot hand portion 21 is guided by the guide rails 27 disposed between the two mother boards 10 having the matrix boards 7a to 7d as shown in FIG. 12.

Figure 14:
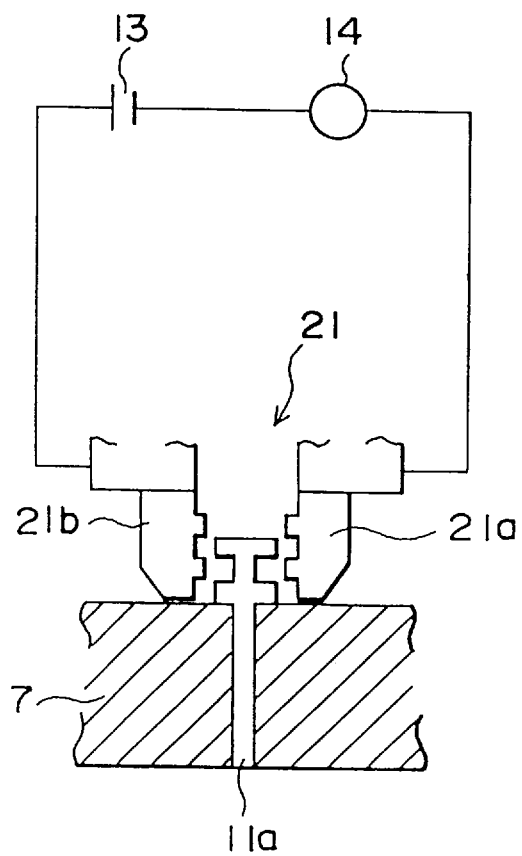
FIG. 14 is a schematic diagram showing a pin holding/detecting structure of a robot hand portion 21.

FIG. 14 is a schematic diagram showing a structure of a pin holding/detecting portion of the robot hand portion 21.

In FIG. 14, the robot hand portion 21 shown in FIG. 13 has a pair of holding portions 21a and 21b that hold connection pins 5 and 6 shown in FIG. 7, a reference pin 11a and measurement pins 11b and 11c shown in FIG. 11. A voltage of the power supply 13 is applied to the holding portion 21a and 21b of the robot hand portion 21. The open/close motor (not shown) of the robot hand portion is driven and, for example, a reference pin 11a is held by the holding portions 21a and 21b. Thus, the holding portions 21a and 21b are electrically connected through the reference pin 11a. The detecting means of the robot hand portion 21 is accomplished by the detecting circuit 14. The detecting means of the measurement pins 11b and 11c by the robot hand portion 21 is accomplished in the same manner.

In FIGS. 11 and 14, a voltage is applied to the holding portions 21a and 21b by the power supply 13. The holding portions 21a and 21b hold for example a reference pin 11a by the hand open/close motor. Thus, the holding portions 21a and 21b are electrically connected through the reference pin 11a. Consequently, the detecting circuit 14 detects the connection state (namely, the holding state of the reference pin 11a). As with the reference pin 11a, the holding state of the measurement pin 11b is detected.

Next, with reference to FIGS. 11 to 14, the operation of the above-described structure will be described.

The moving region A in the X axis direction and the Y axis direction of the robot hand portion 21 shown in FIG. 11 is opposite to the matrix boards 7a to 7d. The zero point position alignment block 26 is disposed at one corner of the moving region A. In this state, the X axis motor and the Y axis motor (not shown) are driven by the control portion 18 corresponding to a command received from an external unit (not shown). Thus, the robot hand portion 21 moves to the zero point position alignment block 26 in the X axis direction and the Y axis direction.

When the stepping motors as the X axis motor and the Y axis motor overload, these motors stop. Thus, the X axis motor and the Y axis motor are driven until the robot hand portion 21 contacts and stops at the zero point position alignment block 26. Consequently, the zero point position alignment of the robot hand portion 21 is performed.

After the zero point position alignment is performed, the control portion 18 causes the calculating portion 17 to calculate the number of drive pulses of the X axis motor and the Y axis motor until the robot hand portion 21 moves to the reference pin 11a.

Corresponding to the calculated result of the calculating portion 17, the control portion 18 drives the X axis motor and the Y axis motor, moves the Y frame 23 in the X axis direction along the X frames 22, and moves the robot hand portion 21 in the Y axis direction along the Y frame 23 so that the robot hand portion 21 is placed opposite to the reference pin 11a.

Thereafter, the control portion 18 drives the Z axis motor and hand open/close motor. Thus, the robot hand portion 21 approaches the matrix board 7a and then the holding portions 21a and 21b of the robot hand portion 21 hold the reference pin 11a.

The detecting circuit 14 detects the state that the holding portions 21a and 21b of the robot hand portion 21 holds the reference pin 11a. When the detected result is sent to the control portion 18, the control portion 18 drives the Z axis motor and the hand open/close motor. Thus, the holding portions 21a and 21b of the robot hand portion 21 release the reference pin 11a. Next, the robot hand portion 21 moves in the Z axis direction and goes away from the matrix boards 7a to 7d.

The control portion 18 causes the calculating portion 17 to calculate the number of drive pulses of the X axis motor for the minimum distance of which the position deviation of the measurement pin 11b due to the assembling error of the matrix board 7b is expected. Corresponding to the calculated result of the calculating portion 17, the control portion 18 drives the X axis motor so as to move the robot hand portion 21 in the X axis direction along the X frames 22 together with the Y frame 23. Thereafter, the control portion 18 drives the Z axis motor and the hand open/close motor. Thus, the robot hand portion 21 approaches the matrix board 7b and the holding portions 21a and 21b hold the measurement pin 11b.

Thus, the detecting circuit 14 detects the state that the holding portions 21a and 21b hold the measurement pin 11b. When the detection signal is sent to the control portion 18, the control portion 18 causes the calculating portion 17 to calculate the amount of relative deviation between the robot hand portion 21 and the measurement pin 1b in the axial direction and the Y axis direction. The control portion 17 causes the first storage portion 15 and the second storage portion 16 to store compensation data $\Delta x$ in the X axis direction and the compensation data $\Delta y$ in the Y axis direction, respectively.

If the detecting circuit 14 does not detect the state that the holding portions 21a and 21b hold the measurement pin 11b, the control portion 18 drives the Z axis motor so that the robot hand portion 21 goes away from the matrix board 7b. In addition, the control portion 18 drives the X axis motor and the open/close motor for a predetermined number of pulses. Thus, the holding portions 21a and 21b of the robot hand portion 21 hold the reference pin 21 once again.

The holding operation is repeated until the holding portions 21a and 21b of the robot hand portion 21 hold the measurement pin 11b. However, even if the robot hand portion 21 moves in the X axis direction, when the detecting circuit 14 does not detect the state that the holding portions 21a and 21b hold the measurement pin 11b, the control portion 18 drives the Y axis motor for a predetermined number of pulses. In addition, the control portion 18 drives the X axis motor for a predetermined number of pulses. The retry operation is repeated until the holding portions 21a and 21b hold the measurement pin 11b.

When the detecting circuit 14 detects the state that the holding portions 21a and 21b hold the measurement pin 11b by the retry operation and the detection signal is sent to the control portion 18, the control portion 18 causes the calculating portion 17 to calculate the amount of relative deviation of the robot hand portion 21 to the measurement pin 11b in the X axis direction and the Y axis direction. The control portion 18 causes the first storage portion 15 and the second storage portion 16 to store data $\Delta x$ as the compensation amount and data $\Delta y$ as the compensation amount.

The compensation amount data $\Delta x$ and $\Delta y$ are measured and stored when the automatic pin inserting/removing robot 20 is initially set or the automatic pin inserting/removing robot 20 is replaced.

Next, with reference to FIGS. 11 to 14, a position alignment operation of the robot hand portion 21 of the automatic pin inserting/removing robot 20 to pin holes of the matrix boards 7a to 7d will be described.

While the robot hand portion 21 of the automatic pin inserting/removing robot 20 stops at the zero point position of the zero point position alignment block 26, when coordinate data of a target pin hole is received from the external unit, the control portion 18 causes the calculating portion 17 to calculate the number of drive pulses of the X axis motor and the Y axis motor for which the robot hand portion 21 reaches the reference pin 11a. Corresponding to the calculated result, the control portion 18 drives the X axis motor and the Y axis motor. The robot hand portion 21 moves the Y frame 23 in the X axis direction along the X frames 22. In addition, the robot hand portion 21 moves along the Y frame 23 in the Y axis direction.

Thus, after aligning the robot hand portion 21 to the position corresponding to the reference pin 11a, the control portion 18 causes the calculating portion 17 to calculate the number of drive pulses of the X axis motor for which the robot hand portion 21 moves to a target pin hole corresponding to the compensation data Δx stored in the first storage portion 15. In addition, the control portion 18 causes the calculating portion 17 to calculate the number of drive pulses of the Y axis motor for which the robot hand portion 21 moves to a target pin hole corresponding to the compensation data Δy stored in the second storage portion 16. Corresponding to the calculated result of the calculating portion 17, the control portion drives the X axis motor and the Y axis motor. Thus, the robot hand portion 21 moves in the X axis direction together with the Y frame 23 along the X frames 22. Consequently, the robot hand portion 21 is accurately aligned to the target pin hole.

Thereafter, the control portion 18 causes the Z axis motor and the open/close motor of the robot hand portion to move so that the holding portions 21a and 21b of the robot hand portion 21 insert or remove a connection pin into/from the target pin hole.

In the above-described embodiments, the holding portions 21a and 21b of the robot hand portion 21 hold the measurement pin 11b on the matrix board 7b, thereby obtaining the compensation data Δx and Δy. However, as shown in FIGS. 10 and 12, with the measurement pin 11c at the outer corner portion of the matrix board 7c, the compensation data Δx is obtained in the X axis direction so as to obtain the compensation data Δy in the Y axis direction.

Thus, cables between matrix boards are omitted unlike with the related art reference. Consequently, the size and weight and cost of the apparatus can be reduced. In addition, the density of the matrix boards can be increased.

What is claimed is:

1. An automatic MDF apparatus, comprising:
    a plurality of first-staged matrix boards having a plurality of input lines that are insulated from each other and disposed in the X axis direction and a plurality of output lines that are insulated from each other and disposed in the Y axis direction, the input lines and the output lines being arranged in a matrix pattern;
    a plurality of second-staged matrix boards having a plurality of input lines that are insulated from each other and disposed in the X axis direction and a plurality of output lines that are insulated from each other and disposed in the Y axis direction, the input lines and the output lines being arranged in a matrix pattern, said second-staged matrix boards being disposed perpendicular to said first-staged matrix boards;
    a plurality of third-staged matrix boards having a plurality of input lines that are insulated from each other and disposed in the X axis direction and a plurality of output lines that art insulated from each other and disposed in the Y axis direction, the input lines and the output lines being arranged in a matrix pattern, said third-staged matrix boards being disposed perpendicular to said second-staged matrix boards; and a center board having a common connecting plane disposed between said first-staged matrix boards and said second-staged matrix boards and disposed between said second-staged matrix boards and said third-staged matrix boards,
    wherein said center board, said first-staged matrix boards, said second-staged matrix boards, and said third-staged matrix boards, are connected through connectors.

2. The automatic MDF apparatus as set forth in claim 1, wherein said first-staged matrix boards, said second-staged matrix boards, and said third-staged matrix boards each have a first matrix circuit and a second matrix circuit, the first matrix circuit having a first layer, a second layer, and a third layer, and a fourth layer, the first layer and the third layer having the input lines in the X axis direction, the second layer and the fourth layer having the output lines in the Y axis direction, the first layer, the second layer, the third layer, and the fourth layer being insulated from each other, first pin holes being formed at intersections of the input lines on the first layer and the third layer and the output lines on the second layer and the fourth layer, the second matrix circuit having a fifth layer, a sixth layer, and a seventh layer, and an eighth layer, the fifth layer and the seventh layer having the input lines in the X axis direction, the sixth layer and the eighth layer having the output lines in the Y axis direction, the fifth layer, the sixth layer, the seventh layer, and the eighth layer being insulated from each other, second pin holes being formed at intersections of the input lines on the fifth layer and the seventh layer and the output lines on the sixth layer and the eighth layer,
    wherein connection pins are inserted into the first pin holes and the second pin holes so as to electrically connect desired input lines and desired output lines, and
    wherein the first matrix circuit and the second matrix circuit are disposed as upper and lower layers in such a manner that the first pin holes and the second pin holes are positioned with a deviation of a half lattice pitch.

3. An automatic MDF apparatus having an automatic connection pin inserting/removing robot control unit, comprising:
    a plurality of matrix boards having pin holes into which connection pins are inserted, the pin holes being formed in a matrix pattern in the X axis direction and the Y axis direction;
    a robot hand portion for holding and releasing a connection pin;
    a zero point position alignment portion disposed at one edge of a moving region of said robot hand portion;
    a reference pin disposed on a matrix board in the vicinity of said zero point position alignment portion;
    a measurement pin disposed on a matrix board different from the matrix board having said reference pin;
    detecting means for detecting whether said robot hand portion holds or releases said reference pin and said measurement pin;

first storage means for storing compensation data for an amount of movement of said robot hand portion in the Y axis direction;

second storage means for storing compensation data for an amount of movement of said robot hand portion in the Y axis direction;

calculating means for calculating the amount of movement of said robot hand portion, moving said robot hand portion from said zero point position alignment portion in the X axis direction and the Y axis direction, repeating the moving operation of said robot hand portion until said robot hand portion holds said reference pin, and calculating the amount of relative deviation between said robot hand portion and said measurement pin in the X axis direction and the Y axis direction; and control means for controlling the moving amount of said robot hand portion in the X axis direction and the Y axis direction corresponding to the compensation data stored in said first storage means and said second storage means so as to align said robot hand portion to a particular pin hole when the connection pin is inserted or removed into/from the particular pin hole of the matrix board.

4. The automatic MDF apparatus as set forth in claim 3, wherein said robot hand portion is composed of a pair of holding portions for holding and releasing the connection pin.

5. An automatic MDF apparatus, comprising:

a plurality of first-staged printed wiring boards, each carrying at least one matrix board having a plurality of input lines that are insulated from each other and disposed in the X axis direction and a plurality of output lines that are insulated from each other and disposed in the Y axis direction, the input lines and the output lines being arranged in a matrix pattern;

a plurality of second-staged printed wiring boards, each carrying at least one second-staged matrix board having a plurality of input lines that are insulated from each other and disposed in the X axis direction and a plurality of output lines that are insulated from each other and disposed in the Y axis direction, the input lines and the output lines being arranged in a matrix pattern, said second-staged printed wiring boards being disposed perpendicular to said first-staged printed wiring boards;

a plurality of third-staged printed wiring boards, each carrying at least one third-staged matrix board having a plurality of input lines that are insulated from each other and disposed in the X axis direction and a plurality of output lines that are insulated from each other and disposed in the Y axis direction, the input lines and the output lines being arranged in a matrix pattern, said third-staged printed wiring boards being disposed perpendicular to said second-staged printed wiring boards; and a center board having a common connecting plane disposed between said first-staged printed wiring boards and said second-staged printed wiring boards and disposed between said second-staged printed wiring boards and said third-staged printed wiring boards, wherein said center board, said first-staged printed wiring boards, said second printed wiring boards, and said third printed wiring boards are connected through connectors.

6. The automatic MDF apparatus as set forth in claim 5, wherein said at least one first-staged matrix board, said at least one second-staged matrix board, and said at least one third-staged matrix board each have a first matrix circuit and a second matrix circuit, the first matrix circuit having a first layer, a second layer, and a third layer, and a fourth layer, the first layer and the third layer having the input lines in the X axis direction, the second layer and the fourth layer having the output lines in the Y axis direction, the first layer, the second layer, the third layer, and the fourth layer being insulated from each other, first pin holes being formed at intersections of the input lines on the first layer and the third layer and the output lines on the second layer and the fourth layer, the second matrix circuit having a fifth layer, a sixth layer, and a seventh layer, and an eighth layer, the fifth layer and the seventh layer having the input lines in the X axis direction, the sixth layer and the eighth layer having the output lines in the Y axis direction, the fifth layer, the sixth layer, the seventh layer, and the eighth layer being insulated from each other, second pin holes being formed at intersections of the input lines on the fifth layer and the seventh layer and the output lines on the sixth layer and the eighth layer, wherein connection pins are inserted into the first pin holes and the second pin holes so as to electrically connect desired input lines and desired output lines, and wherein the first matrix circuit and the second matrix circuit are disposed as upper and lower layers in such a manner that the first pin holes and the second pin holes are positioned with a deviation of a half lattice pitch.

7. An electrical apparatus, comprising:

a center board having first and second sides;

a plurality of first printed circuit boards adjacent the first side of the center board, the first printed circuit boards being disposed substantially parallel to one another and substantially perpendicular to the center board;

a plurality of second printed circuit boards adjacent the second side of the center board, the second printed circuit boards being disposed substantially parallel to one another and substantially perpendicular to the center board and to the first printed circuit boards; and connector means for connecting wiring on the first printed circuit boards to wiring on the second printed circuit boards through the center board.

8. The electrical apparatus of the claim 7, further comprising a plurality of additional printed circuit boards adjacent the first side of the center board, the additional printed circuit boards being disposed substantially parallel to the first printed circuit boards, and wherein the connector means additionally comprises means for connecting wiring on the second printed circuit boards to wiring on the additional printed circuit boards through the center board.

9. The electrical apparatus of claim 8, wherein the connector means comprises connector elements mounted on the first printed circuit boards at edge regions thereof, connector elements mounted on the second printed circuit boards at edge regions thereof, connector elements mounted on the additional printed circuit boards at edge regions thereof, and connector elements mounted on the center board to mate with the connector elements mounted on the printed circuit boards.

10. The electrical apparatus of claim 7, wherein the first printed circuit boards are matrix boards each having a plurality of input lines that are insulated from each other in an input line layer and that are disposed in a first direction, and a plurality of output lines that are insulated from one another in an output line layer and that are disposed in a second direction which is substantially orthogonal to the first direction, the output lines being connected to the connector means, and wherein the matrix boards have pin holes at intersections of the input lines and output lines.

11. The electrical apparatus of claim 10, wherein the matrix boards additionally each have a plurality of further input lines that are insulated from each other in a further input line layer and that are disposed in the first direction, and a plurality of further output lines that are insulated from each other in a further output line layer and that are disposed in the second direction.

12. The electrical apparatus of claim 11, wherein the input lines are aligned with the further input lines and the output lines are aligned with the further output lines, so that the pin holes intersect not only the input lines and output lines, but also the further input lines and further output lines.

13. The electrical apparatus of claim 12, wherein the matrix boards additionally each have a plurality of additional input lines that are insulated from each other in a pair of addition input line layers and that are disposed in the first direction, and a plurality of additional output lines that are insulated from each other in a pair of additional output line layers and that are disposed in the second direction, the additional input and output lines having intersections that are offset from the pin holes, and wherein the matrix boards have additional pin holes at the intersections of the additional input and output lines.

14. The electrical apparatus of claim 13, further comprising a plurality of pins, and a robot to place the pins in the pin holes and additional pin holes or remove the pins from the pin holes and additional pin holes.

15. The electrical apparatus of claim 7, further comprising a plurality of matrix boards each having a plurality of input lines that are insulated from each other in an input line layer and that are disposed in a first direction, and a plurality of output lines that are insulated from one another in an output line layer and that are disposed in a second direction which is substantially orthogonal to the first direction, the matrix boards having pin holes at intersections of the input lines and the output lines, and wherein each first printed circuit board has at least one of the matrix boards mounted on it, with the output lines of the at least one of the matrix boards being connected to the connector means.

16. The electrical apparatus of claim 15, wherein the matrix boards additionally each have a plurality of further input lines that are insulated from each other in a further input line layer and that are disposed in the first direction, and a plurality of further output lines that are insulated from each other in a further output line layer and that are disposed in the second direction.

17. The electrical apparatus of claim 16, wherein the input lines are aligned with the further input lines and the output lines are aligned with the further output lines, so that the pin holes intersect not only the input lines and output lines, but also the further input lines and further output lines.

18. The electrical apparatus of claim 17, wherein the matrix boards additionally each have a plurality of additional input lines that are insulated from each other in a pair of additional input line layers and that are disposed in the first direction, and a plurality of additional output lines that are insulated from each other in a pair of additional output line layers and that are disposed in the second direction, the additional input and output lines having intersections that are offset from the pin holes, and wherein the matrix boards have additional pin holes at the intersections of the additional input and output lines.

19. The electrical apparatus of claim 18, further comprising a plurality of pins, and a robot to place the pins in the pin holes and additional pin holes or remove the pins from the pin holes and additional pin holes.

* * * * *